United States Patent
Lin et al.

(10) Patent No.: US 9,384,984 B2
(45) Date of Patent: Jul. 5, 2016

(54) SEMICONDUCTOR STRUCTURE AND METHOD OF FORMING THE SAME

(71) Applicant: United Microelectronics Corp., Hsinchu (TW)

(72) Inventors: Chun-Hsien Lin, Tainan (TW); Min-Hsien Chen, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/017,001

(22) Filed: Sep. 3, 2013

(65) Prior Publication Data

US 2015/0061041 A1     Mar. 5, 2015

(51) Int. Cl.

| | |
|---|---|
| *H01L 29/76* | (2006.01) |
| *H01L 21/28* | (2006.01) |
| *H01L 29/49* | (2006.01) |
| *H01L 29/66* | (2006.01) |
| *H01L 21/8238* | (2006.01) |
| *H01L 29/51* | (2006.01) |
| *H01L 29/165* | (2006.01) |

(52) U.S. Cl.
CPC .. *H01L 21/28088* (2013.01); *H01L 21/823842* (2013.01); *H01L 29/4966* (2013.01); *H01L 29/66545* (2013.01); *H01L 29/66575* (2013.01); *H01L 29/165* (2013.01); *H01L 29/513* (2013.01); *H01L 29/517* (2013.01); *H01L 29/66636* (2013.01)

(58) Field of Classification Search
CPC ............... H01L 21/28088; H01L 21/823842; H01L 29/4966; H01L 29/66545; H01L 29/66575; H01L 29/165; H01L 29/513; H01L 29/517; H01L 29/66636
USPC ............... 257/410–412, 387–388, 369
See application file for complete search history.

(56) References Cited

U.S. PATENT DOCUMENTS

| | | |
|---|---|---|
| 5,892,282 A | 4/1999 | Hong et al. |
| 6,096,659 A | 8/2000 | Gardner et al. |
| 6,177,303 B1 | 1/2001 | Schmitz et al. |
| 6,271,136 B1 | 8/2001 | Shue et al. |
| 6,303,418 B1 | 10/2001 | Cha et al. |
| 6,458,684 B1 | 10/2002 | Guo et al. |
| 6,573,134 B2 | 6/2003 | Ma et al. |
| 6,596,643 B2 | 7/2003 | Chen et al. |
| 6,960,416 B2 | 11/2005 | Mui et al. |
| 7,126,199 B2 | 10/2006 | Doczy et al. |
| 7,144,783 B2 | 12/2006 | Datta et al. |

(Continued)

OTHER PUBLICATIONS

Veloso et al., "Gate-Last vs. Gate-First Technology for aggressively scaled EOT Logic/RF CMOS," Symposium on VLSI Technology Digest of Technical Papers, Jun. 14-16, 2011, pp. 34-35.

(Continued)

*Primary Examiner* — Thanh T Nguyen
(74) *Attorney, Agent, or Firm* — J.C. Patents

(57) ABSTRACT

A method of forming a semiconductor device is disclosed. A substrate having a dielectric layer thereon is provided. The dielectric layer has a gate trench therein and a gate dielectric layer is formed on a bottom of the gate trench. A work function metal layer and a top barrier layer are sequentially formed in the gate trench. A treatment is performed to the top barrier layer so as to form a silicon-containing top barrier layer. A low-resistivity metal layer is formed in the gate trench.

7 Claims, 7 Drawing Sheets

(56) References Cited

U.S. PATENT DOCUMENTS

| | | |
|---|---|---|
| 7,148,548 B2 | 12/2006 | Doczy et al. |
| 7,153,784 B2 | 12/2006 | Brask et al. |
| 7,176,090 B2 | 2/2007 | Brask et al. |
| 7,186,605 B2 | 3/2007 | Cheng et al. |
| 7,208,361 B2 | 4/2007 | Shah et al. |
| 7,217,611 B2 | 5/2007 | Kavalieros et al. |
| 7,355,281 B2 | 4/2008 | Brask et al. |
| 7,407,876 B2 | 8/2008 | Ishizaka |
| 7,556,998 B2 | 7/2009 | Park et al. |
| 7,700,479 B2 | 4/2010 | Huang et al. |
| 2006/0024953 A1 | 2/2006 | Papa Rao et al. |
| 2007/0145591 A1 | 6/2007 | Yano et al. |
| 2007/0259519 A1 | 11/2007 | Yang et al. |
| 2007/0262451 A1 | 11/2007 | Rachmady et al. |
| 2007/0272123 A1 | 11/2007 | Kennedy et al. |
| 2008/0076216 A1 | 3/2008 | Pae et al. |
| 2008/0224235 A1 | 9/2008 | Lavoie et al. |
| 2009/0057769 A1 | 3/2009 | Wei et al. |
| 2009/0186458 A1 | 7/2009 | Yu et al. |
| 2010/0044783 A1 | 2/2010 | Chuang et al. |
| 2010/0052079 A1* | 3/2010 | Hirano et al. ............. 257/412 |
| 2010/0065926 A1 | 3/2010 | Yeh et al. |
| 2010/0068877 A1 | 3/2010 | Yeh et al. |
| 2010/0087055 A1 | 4/2010 | Lai et al. |
| 2010/0124818 A1 | 5/2010 | Lee et al. |
| 2010/0244141 A1 | 9/2010 | Beyer et al. |
| 2011/0175147 A1 | 7/2011 | Adusumilli et al. |
| 2011/0189847 A1* | 8/2011 | Tsai et al. ............. 438/595 |
| 2013/0056836 A1* | 3/2013 | Yu ............. H01L 21/823807 257/410 |
| 2013/0075826 A1* | 3/2013 | Xu ............. 257/369 |

OTHER PUBLICATIONS

Kun-Yuan Lo et al, U.S. Appl. No. 13/875,289, filed May 5, 2013, title: Ffield-Effect Transistor and Fabricating Method Thereof.

* cited by examiner

SEMICONDUCTOR STRUCTURE AND METHOD OF FORMING THE SAME

BACKGROUND OF THE INVENTION

1. Field of Invention

The present invention relates to a semiconductor structure and a method of forming the same, and more generally to a semiconductor device having a metal gate and a method of forming the same.

2. Description of Related Art

MOS is a basic structure widely applied to various semiconductor devices, such as memory devices, image sensors and display devices. An electric device is required to be made lighter, thinner and smaller. As the CMOS is continuously minimized, a logic CMOS technology is developed towards a technology having a high dielectric constant (high-k) dielectric layer and a metal gate.

The metal gate usually contains aluminium (Al) or copper (Cu), which is prone to diffusion or electro-migration into surrounding materials and thereby deteriorates the performance of the metal-gate device. A single barrier layer (e.g. TiN) is thus provided to prevent diffusion of metals. However, such single barrier layer is usually thinner at the bottom corner of the gate trench and incapable of providing enough barrier properties.

SUMMARY OF THE INVENTION

Accordingly, the present invention provides a method of forming a semiconductor structure, by which a multi-layer top barrier structure can be formed to effectively block the metal diffusion and thereby improve the performance of the device.

The present invention provides a method of forming a semiconductor device. A substrate having a dielectric layer thereon is provided. The dielectric layer has a gate trench therein and a gate dielectric layer is formed on a bottom of the gate trench. A work function metal layer and a top barrier layer are sequentially formed in the gate trench. A treatment is performed to the top barrier layer so as to form a silicon-containing top barrier layer. A low-resistivity metal layer is formed in the gate trench.

According to an embodiment of the present invention, the top barrier layer is a stacked structure including at least one N-rich TiN layer and at least one Ti-rich TiN layer, and an upmost layer of the stacked structure is a Ti-rich TiN layer.

According to an embodiment of the present invention, the treatment transforms a portion of the upmost Ti-rich TiN layer into a TiSiN layer.

According to an embodiment of the present invention, the treatment completely transforms the upmost Ti-rich TiN layer into a TiSiN layer.

According to an embodiment of the present invention, the treatment includes introducing a silicon-containing gas and a nitrogen-containing gas to stuff grain boundaries of the upmost Ti-rich TiN layer.

According to an embodiment of the present invention, the treatment includes a silicification treatment and a nitridation treatment.

According to an embodiment of the present invention, a gas used in the silicification treatment includes silane ($SiH_4$) and a gas used in the nitridation treatment includes ammonia ($NH_3$).

According to an embodiment of the present invention, the work function metal layer has a substantially planar surface on the bottom of the gate trench.

According to an embodiment of the present invention, a method of achieving the substantially planar surface of the work function metal layer includes performing a radio frequency PVD (RFPVD) process.

According to an embodiment of the present invention, the method further includes forming a bottom barrier layer between the gate dielectric layer and the work function metal layer.

According to an embodiment of the present invention, the gate dielectric layer is formed before the step of forming the dielectric layer.

According to an embodiment of the present invention, the gate dielectric layer is formed after the step of forming the gate trench.

The present invention further provides a semiconductor structure, which includes a substrate, a dielectric layer disposed on the substrate and having a gate trench therein, a gate dielectric layer at least disposed on a bottom of the gate trench, a low-resistivity metal layer disposed in the gate trench, a work function metal layer disposed between the low-resistivity metal layer and the gate dielectric layer, and a silicon-containing top barrier layer, disposed between the low-resistivity metal layer and the work function metal layer.

According to an embodiment of the present invention, the silicon-containing top barrier layer includes TiSiN.

According to an embodiment of the present invention, the semiconductor structure further includes at least one top barrier layer disposed between the work function metal layer and the silicon-containing top barrier layer.

According to an embodiment of the present invention, the top barrier layer is a Ti-rich TiN layer.

According to an embodiment of the present invention, the top barrier layer is an N-rich TiN layer.

According to an embodiment of the present invention, each of the work function metal layer, the at least one top barrier layer and the silicon-containing top barrier layer has a substantially planar surface on the bottom surface of the gate trench.

According to an embodiment of the present invention, the semiconductor structure further includes a bottom barrier layer disposed between the gate dielectric layer and the work function metal layer.

According to an embodiment of the present invention, the gate dielectric layer is further disposed on a sidewall of the gate trench.

In view of the above, in the present invention, a silicification treatment and a nitridation treatment are performed to the surface of the mutli-layer top barrier structure to stuff the grain boundaries of TiN and therefore forms TiSiN. Further, the multi-layer top barrier structure can be formed with a uniform thickness at the bottom corner of the gate trench and therefore provides enough barrier properties. Besides, it is easy and simple to integrate the method of the invention into the existing CMOS process, thereby achieving competitive advantages over competitors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2D-1 are schematic cross-sectional views illustrating a method of forming a semiconductor structure according to a second embodiment of the present invention.

DESCRIPTION OF EMBODIMENTS

Figure 1A:
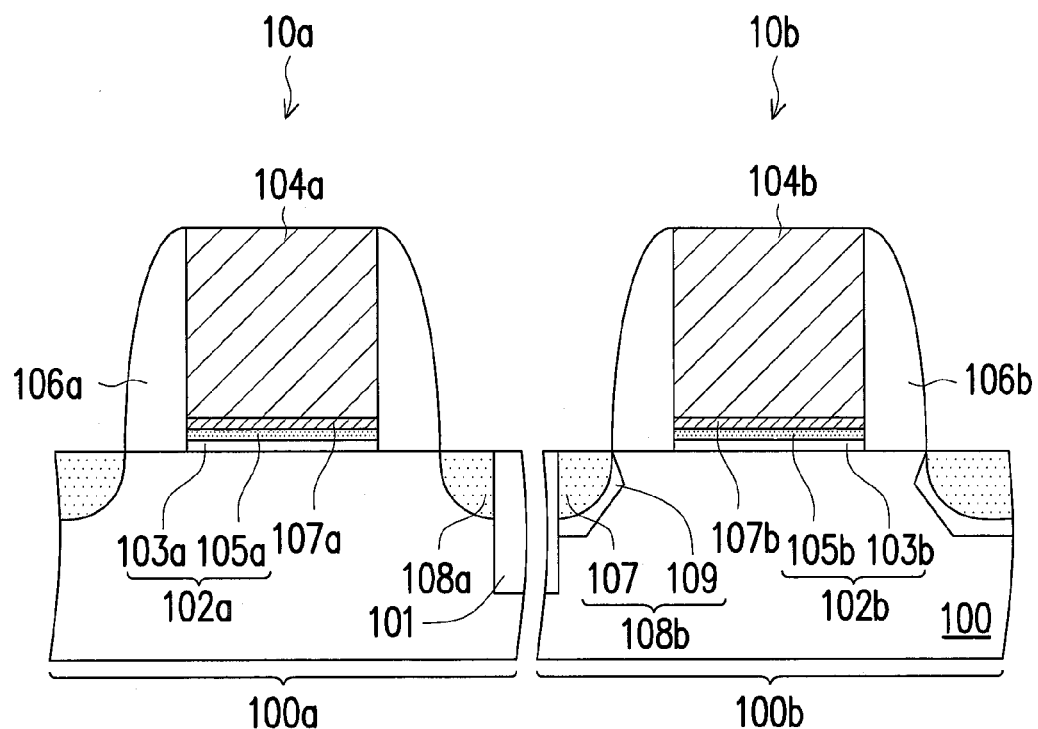
FIG. 1A to FIG. 1F-1 are schematic cross-sectional views illustrating a method of forming a semiconductor structure according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1A to FIG. 1F-1 are schematic cross-sectional views illustrating a method of forming a semiconductor structure according to a first embodiment of the present invention. In this embodiment, the method of the invention is integrated with the "high-k first" process for illustration.

Referring to FIG. 1A, at least one gate structure is formed on a substrate 100. The substrate 100 can be a semiconductor substrate, such as a silicon substrate. In this embodiment, the substrate 100 has a first area 100a and a second area 100b, and gate structures 10a and 10b are respectively formed in the first and second areas 100a and 100b, but the present invention is not limited thereto. At least one shallow trench isolation (STI) structure 101 is formed in the substrate 100 between the gate structures 10a and 10b for providing electrical isolation. The first and second areas 100a and 100b are for forming semiconductor devices with different conductivity types. In an embodiment, the first area 100a is for forming an N-type device, and the second area 100b is for forming a P-type device.

The gate structure 10a includes a gate dielectric layer 102a and a dummy gate 104a sequentially formed on the substrate 100. Similarly, the gate structure 10b includes a gate dielectric layer 102b and a dummy gate 104b sequentially formed on the substrate 100. The gate dielectric layer 102a can be a composite layer containing an insulating layer 103a and a high-k layer 105a. Similarly, the gate dielectric layer 102b can be a composite layer containing an insulating layer 103b and a high-k layer 105b. Each of the insulating layers 103a and 103b includes silicon oxide or silicon oxynitride. Each of the high-k layers 105a and 105b includes a high-k material (i.e. a dielectric material with a dielectric constant greater than 4). The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Each of the dummy gates 104a and 104b includes amorphous silicon, crystalline silicon or a combination thereof. The dummy gates 104a and 104b can be doped or undoped.

In addition, a bottom barrier layer 107a is further formed between the high-k layer 105a and the dummy gate 104a. Similarly, a bottom barrier layer 107b is further formed between the high-k layer 105b and the dummy gate 104b. Each of the bottom barrier layers 107a and 107b includes TiN. The bottom barrier layers 107a and 107b have a thickness of 20 angstroms, for example.

The method of forming the gate dielectric layers 102a/102b, the bottom barrier layers 107a/107b and the dummy gates 104a/104b includes stacking required material layers and then patterning the said material layers. The said material layers can be stacked by a furnace process or/and a deposition process such as a physical vapor deposition (PVD) process, chemical vapor deposition (CVD) process or an atomic layer deposition (ALD) process.

Continue referring to FIG. 1A, the gate structure 10a further includes a spacer 106a formed on the sidewall of the dummy gate 104a. Similarly, the gate structure 10b further includes a spacer 106b formed on the sidewall of the dummy gate 104b. Each of the spacers 106a and 106b includes silicon oxide, silicon nitride, silicon oxynitride or a combination thereof. The method of forming the spacers 106a/106b includes depositing a spacer material layer on the substrate 100, and then performing an anisotropic etching process to the spacer material layer.

The gate structure 10a further includes two source/drain regions 108a formed in the substrate 100 beside the dummy gate 104a. Similarly, the gate structure 10b further includes two source/drain regions 108b formed in the substrate 100 beside the dummy gate 104b. In this embodiment, the source/drain regions 108a in the first area 100a can be N-type doped regions, and the source/drain regions 108b in the second area 100b can be combination of P-type doped regions 107 and SiGe layers 109, but the present invention is not limited thereto. In another embodiment, the source/drain regions 108a in the first area 100a can be combination of N-type doped regions and SiC or SiP layers, and the source/drain regions 108b in the second area 100b can be P-type doped regions. In an embodiment, the method of forming the source/drain regions 108a/108b includes the following steps. N-type doped regions are formed in the first area 100a through an ion implantation process. Thereafter, a mask layer (not shown) is formed to cover the first area 100a. Afterwards, recesses (not shown) are formed in the second area 100b beside the dummy gate 104b. SiGe layers 109 are formed in the recesses and P-type doped regions 107 are then formed in the SiGe layers 109 through an ion implantation process.

Figure 1B:
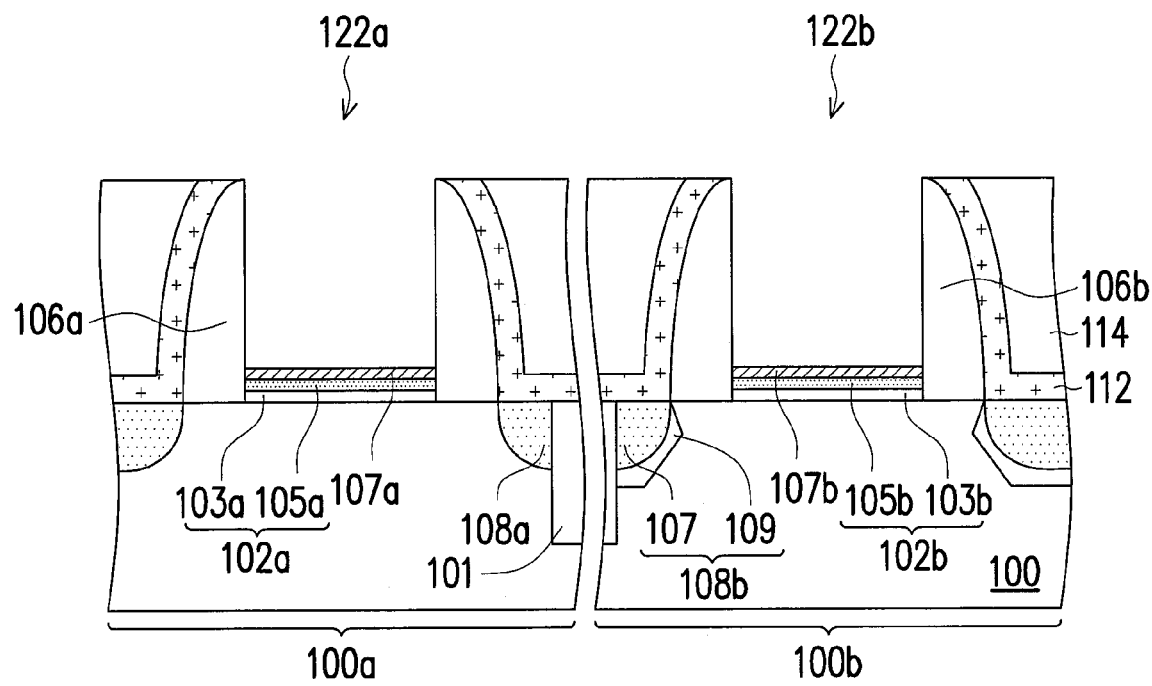

Referring to FIG. 1B, a contact etch stop layer (CESL) 112 and a dielectric layer 114 are formed between the gate structures 10a and 10b and at outer sides of the gate structures 10a and 10b. The CESL 112 includes silicon nitride or a suitable insulating material and the dielectric layer 114 includes silicon oxide, a low-k material, a suitable insulating material or a combination thereof. The method of forming the CESL 112 and the dielectric layer 114 includes forming a contact etch stop material layer and a dielectric material layer, by at least one deposition process (e.g. CVD or ALD), on the substrate 100 covering the gate structures 10a and 10b. Thereafter, a portion of the contact etch stop material layer and the dielectric material layer are removed to expose the tops of the gate structures 10a and 10b. The removing step includes performing a chemical mechanical polishing (CMP) process.

Thereafter, the dummy gates 104a and 104b of the gate structures 10a and 10b are removed to form gate trenches 122a and 122b in the dielectric layer 114. The removing step can be a dry etching step, a wet etching step or a combination thereof.

In view of the above, the substrate 100 has the dielectric layer 114 formed thereon. The dielectric layer 114 has the gate trenches 122a and 122b formed therein. The gate dielectric layers 102a and 102b are formed respectively on the bottoms of the gate trenches 122a and 122b. Besides, the gate dielectric layers 102a and 102b (see FIG. 1A) are formed before the step of forming the dielectric layer 114 (see FIG. 1B).

Figure 1C:
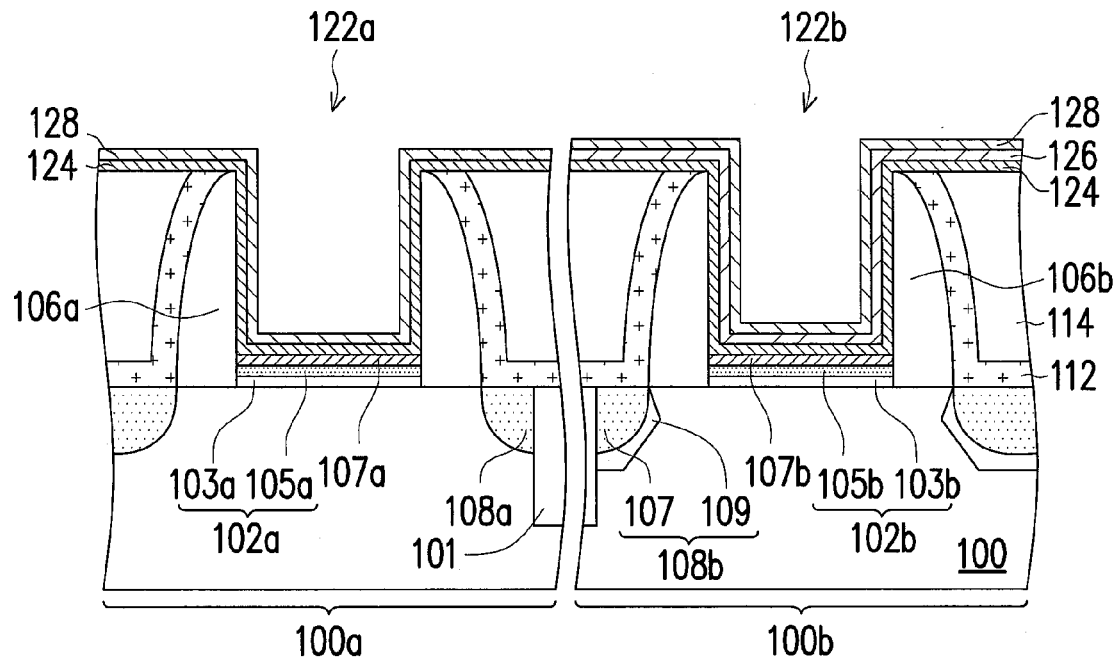

Referring to FIG. 1C, an etch stop metal layer 124 is formed on the substrate 100 filling in the gate trenches 122a and 122b. The etch stop metal layer 124 includes TaN and the forming method thereof includes performing a deposition process such as PVD, CVD or ALD. Thereafter, a first work function metal layer 126 is formed in the gate trench 122b in the second area 100b. In the present embodiment in which a P-type device is formed in the second area 100b, the first work function metal layer 126 includes titanium nitride (TiN), titanium carbide (TiC), tantalum nitride (TaN), tantalum carbide (TaC), tungsten carbide (WC) or aluminum titanium nitride (TiAlN). The method of forming the first work function metal layer 126 includes the following steps. A first work function metal material layer (not shown) is formed on the etch stop metal layer 124 by a radio frequency PVD (RFPVD) process, in which the ratio of RF power to DC power is increased to about 2 so that the first work function metal material layer can be formed with a substantially planar surface. Specifically, the surface (particularly bottom surface) of each of the gate trenches 122a and 122b can be uniformly covered by the first work function metal material layer in this step. The first work function metal material layer has a thickness of about 100 angstroms, for example. Thereafter, a mask layer (not shown) is formed to cover the second area 100b. Afterwards, the first work function metal material layer in the first area 100a is removed.

Afterwards, a second work function metal layer 128 is formed on the substrate 100 filling in the gate trenches 122a and 122b. In the present embodiment in which an N-type device is formed in the first area 100a, the second work function metal layer 128 includes titanium aluminide (TiAl), zirconium aluminide (ZrAl), tungsten aluminide (WAl), tantalum aluminide (TaAl) or hafnium aluminide (HfAl). The method of forming the second work function metal layer 128 includes performing a radio frequency PVD (RFPVD) process, in which the ratio of RF power to DC power is increased to about 2 so that the second work function metal layer 128 can be formed with a substantially planar surface. Specifically, the surface (particularly bottom surface) of each of the gate trenches 122a and 122b can be uniformly covered by the second work function metal layer 128 in this step. The second work function metal layer 128 has a thickness of about 100 angstroms, for example. In this embodiment, the second work function metal layer 128 is formed to have an Al-to-Ti ratio (Al/Ti) greater than 1 such as 1.08.

In this embodiment, since each of the first and second work function metal layers 126 and 128 is formed with a uniform thickness, the conventional overhang formation at tops of the gate trenches can be improved to lower than 44%.

Figure 1D:
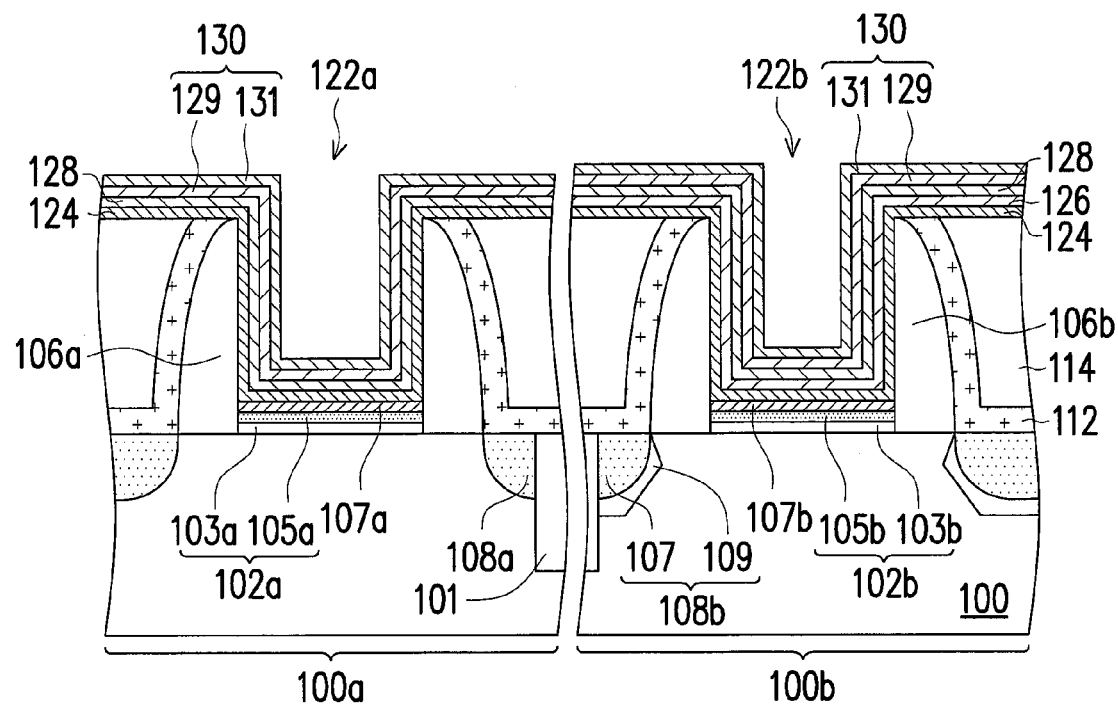

Referring to FIG. 1D, a top barrier layer 130 is formed on the second work function metal layer 128. In this embodiment, the top barrier layer 130 is a stacked structure including an N-rich TiN layer 129 and a Ti-rich TiN layer 131 on the N-rich TiN layer 129. However, the present invention is not limited thereto. In another embodiment, the top barrier layer 130 can be a stacked structure including at least one N-rich TiN layer 129 and at least one Ti-rich TiN layer 131, and the upmost layer of the stacked structure is a Ti-rich TiN layer. In an embodiment (not shown), the top barrier layer 130 can be a stacked structure including, from bottom to top, an N-rich TiN layer, a Ti-rich TiN layer, another N-rich TiN layer and another Ti-rich TiN layer. In another embodiment (not shown), the top barrier layer 130 can be a stacked structure including, from bottom to top, a Ti-rich TiN layer, an N-rich TiN layer and another Ti-rich TiN layer. Herein, the N-rich TiN layer has a Ti-to-N ratio (Ti/N) less than 1, and the Ti-rich TiN layer has a Ti-to-N ratio (Ti/N) greater than 1. The method of forming the top barrier layer 130 includes performing at lest one deposition process (e.g. PVD, CVD or ALD). The top barrier layer 130 has a thickness of about 40 angstroms, for example.

Figure 1E:
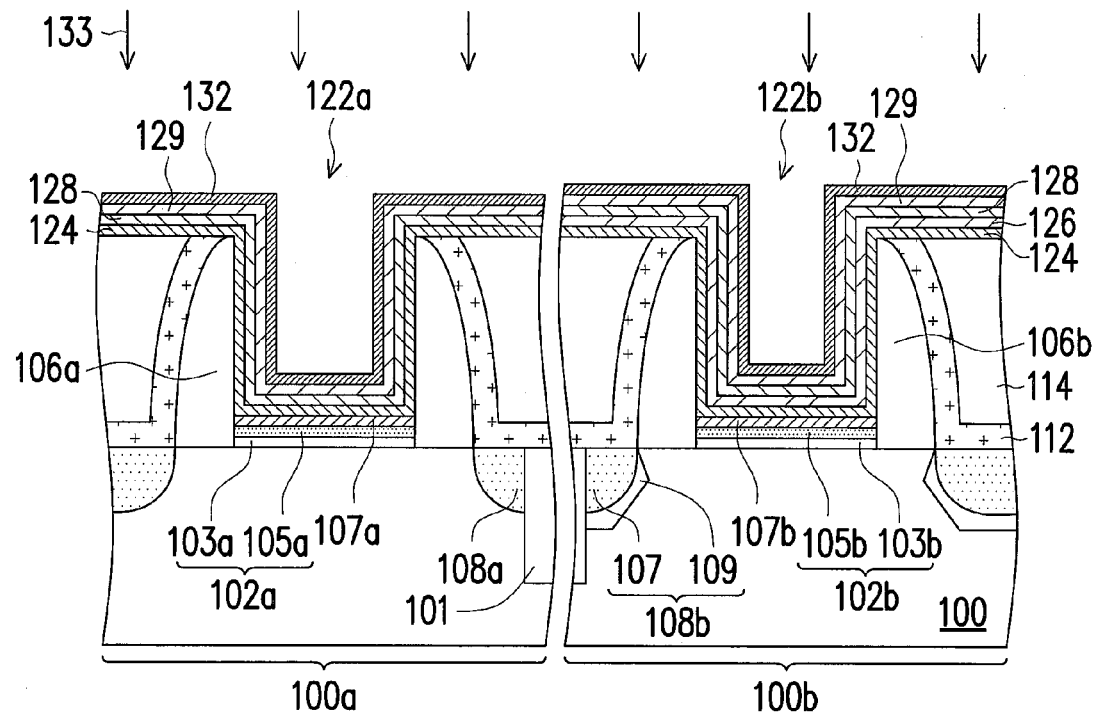
Figures 1, 1E:
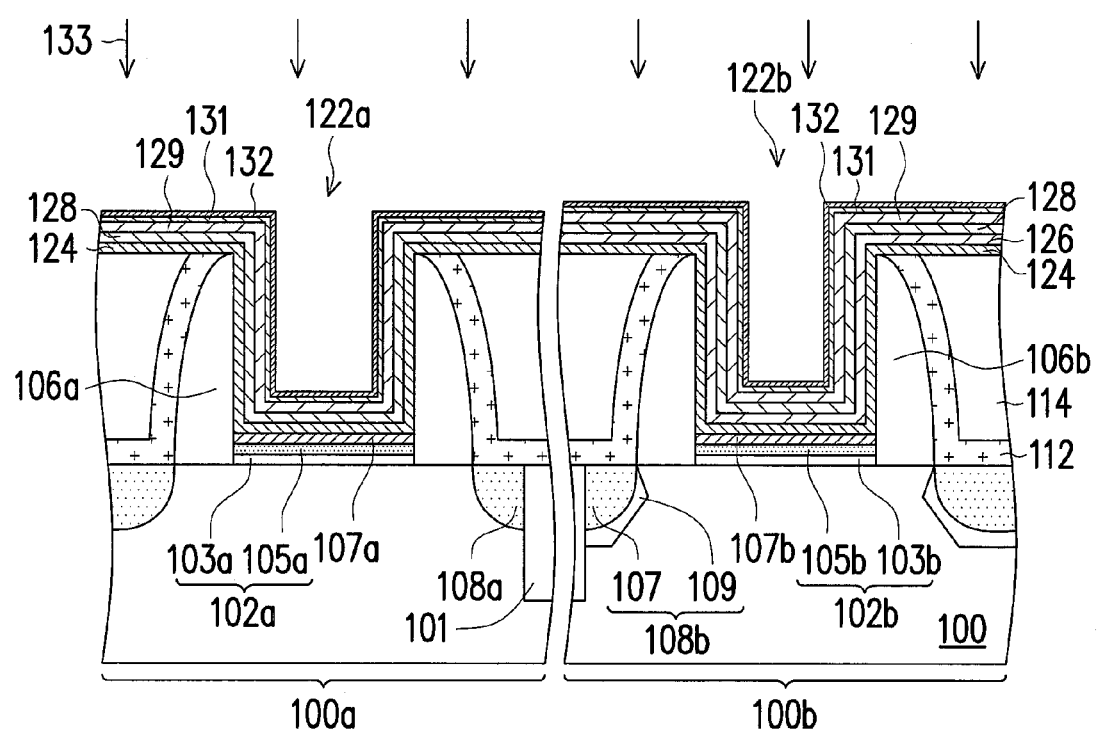

Referring to FIG. 1E, a treatment 133 is performed to the top barrier layer 130 so as to form a silicon-containing top barrier layer 132. The treatment 133 includes introducing a silicon-containing gas and a nitrogen-containing gas to a reaction chamber (e.g. CVD chamber) to stuff grain boundaries of the upmost Ti-rich TiN layer 131. The silicon-containing gas includes silane ($SiH_4$) and the nitrogen-containing gas includes ammonia ($NH_3$). Specifically, the treatment 133 includes a silicification treatment and a nitridation treatment. In the silicification treatment, the low-frequency (LF) power is 0-100 W, the high-frequency (HF) power is 200-600 W, the silane flow rate is 50-200 sccm, the pressure is less than 15 torr, the time is less than 100 second, and the temperature is less than 390° C. In the nitridation treatment, the low-frequency (LF) power is 250-1,500 W, the high-frequency (HF) power is 200-600 W, the ammonium flow rate is 1,500-3,000 sccm, the pressure is less than 15 torr, the time is less than 100 second, and the temperature is less than 390° C. The treatment 133 transforms at least a portion of the upmost Ti-rich TiN layer 131 into a TiSiN layer 132. In an embodiment, the treatment 133 completely transforms the upmost Ti-rich TiN layer 131 into a TiSiN layer 132, as shown in FIG. 1E. In another embodiment, the treatment 133 only transforms a portion of the upmost Ti-rich TiN layer 131 into a TiSiN layer 132, as shown in FIG. 1E-1. For example, at least 25% of the upmost Ti-rich TiN layer 131 is transformed into the TiSiN layer 132.

Figure 1F:
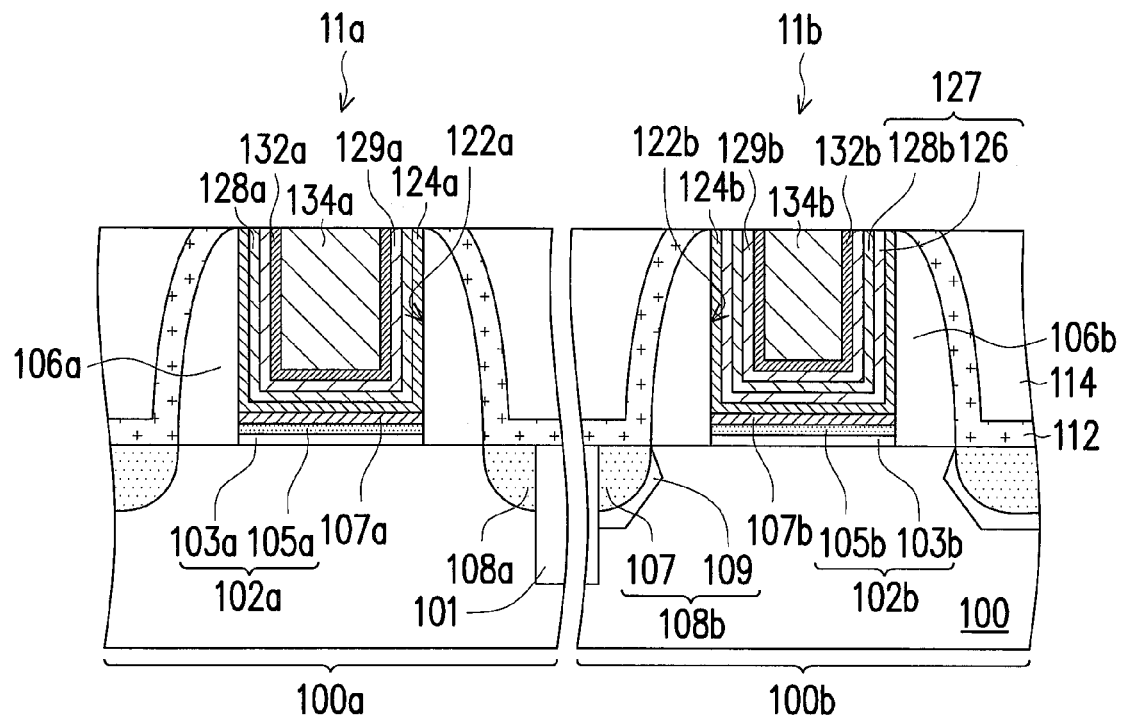
Figures 1, 1F:
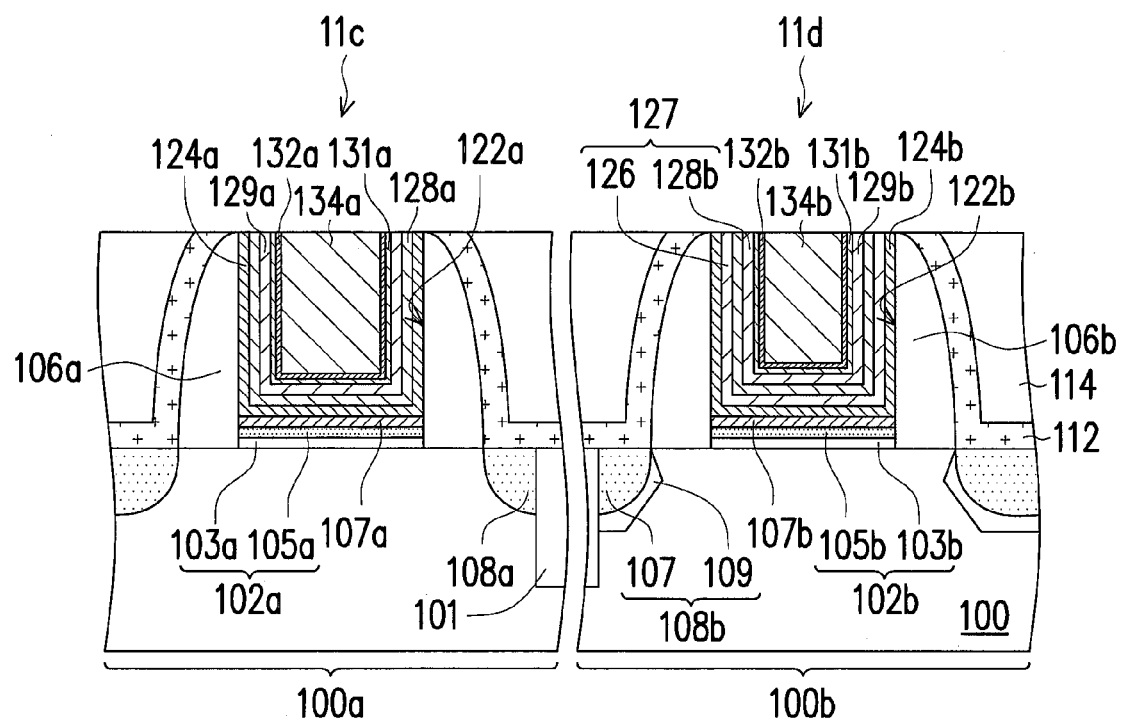

Referring to FIG. 1F and FIG. 1F-1, a low-resistivity metal material layer (not shown) is formed on the substrate 100 filling up the gate trenches 122a and 122b. The low-resistivity metal material layer includes W, Al or Cu and the forming method thereof includes performing a deposition process such as PVD or CVD.

Thereafter, the unnecessary layers outside of the gate trenches 122a and 122b are removed, so as to form an N-MOS device 11a in the first area 100a and form a P-type device 11b in the second area 100b. Similarly, referring to FIG. 1F-1, the unnecessary layers outside of the gate trenches 122a and 122b are removed, so as to form an N-type device 11c in the first area 100a and form a P-type device 11d in the second area 100b. The removing step includes performing a CMP process.

In this embodiment, each of the first work function metal layer 126 and the second work function metal layers 128a/128b is formed with a substantially planar surface on the bottom surface of the corresponding gate trench, so that each of the top barrier layers 129a/129b, 131a/131b and 132a/132b subsequently formed thereon undoubtedly has a substantially planar surface. Thus, the conventional non-uniform thickness of the top barrier layer at bottom corners of the gate trenches is not observed. Besides, the treatment 133 stuffs the grain boundaries of TiN and therefore forms a silicon-containing barrier layer such as TiSiN. The multi-layer top barrier structure having an upmost TiSiN layer can provide enough barrier properties to prevent the low-resistivity metal layers 134a/134b from diffusing into the underlying metal layers.

The semiconductor structures of the present invention are illustrated with reference to FIG. 1F and FIG. 1F-1.

Referring to FIG. 1F, the semiconductor structure in the first area 100a is an N-type device 11a including a substrate 100, a dielectric layer 114 disposed on the substrate 100 and having a gate trench 122a therein, a gate dielectric layer 102a (containing a insulating layer 103a and a high-k layer 105a) disposed on the bottom of the gate trench 122a, a low-resistivity metal layer 134a (e.g. Al) disposed in the gate trench 122a, a work function metal layer 128a (e.g. TiAl) disposed between the low-resistivity metal layer 134a and the gate dielectric layer 102a, and a silicon-containing top barrier layer 132a (e.g. TiSiN) disposed between the low-resistivity metal layer 134a and the work function metal layer 128a.

The N-type device 11a further includes at least one top barrier layer disposed between the work function metal layer 128a and the silicon-containing top barrier layer 132a. In this embodiment, an N-rich TiN layer 129a is disposed between the work function metal layer 128a and the silicon-containing top barrier layer 132a. Therefore, a bi-layer top barrier structure including the N-rich TiN layer 129a and the silicon-containing top barrier layer 132a (e.g. TiSiN) is provided to effectively block diffusion of the low-resistivity metal layer 134a (e.g. Al).

The N-type device 11a further includes a bottom barrier layer 107a (e.g. TiN) disposed between the gate dielectric layer 102a and the work function metal layer 128a and an etch stop metal layer 124a (e.g. TaN) disposed between the work function metal layer 128a and the bottom barrier layer 107a (e.g. TiN).

Referring to FIG. 1F-1, the semiconductor structure in the first area 100a is an N-type device 11c. The N-type device 11c is similar to the N-type device 11a, and the difference between them lies in that a tri-layer top barrier structure is provided for the N-type device 11c instead of the bi-layer top barrier structure for the N-type device 11a. The tri-layer top barrier structure includes, from bottom to top, an N-rich TiN layer 129a, a Ti-rich TiN layer 131a and a silicon-containing top barrier layer 132a (e.g. TiSiN).

Referring to FIG. 1F, the semiconductor structure in the second area 100b is a P-type device 11b including a substrate 100, a dielectric layer 114 disposed on the substrate 100 and having a gate trench 122b therein, a gate dielectric layer 102b (containing a insulating layer 103b and a high-k layer 105b) disposed on the bottom of the gate trench 122b, a low-resistivity metal layer 134b (e.g. Al) disposed in the gate trench 122b, a work function metal layer 127 (containing a work function metal layer 126 (e.g. TiN) and a work function metal layer 128b (e.g. TiAl)) disposed between the low-resistivity metal layer 134b and the gate dielectric layer 102b, and a silicon-containing top barrier layer 132b (e.g. TiSiN) disposed between the low-resistivity metal layer 134b and the work function metal layer 127.

The P-type device 11b further includes at least one top barrier layer disposed between the work function metal layer 127 and the silicon-containing top barrier layer 132b. In this embodiment, an N-rich TiN layer 129b is disposed between the work function metal layer 127 and the silicon-containing top barrier layer 132b. Therefore, a bi-layer top barrier structure including the N-rich TiN layer 129b and the silicon-containing top barrier layer 132b (e.g. TiSiN) is provided to effectively block diffusion of the low-resistivity metal layer 134b (e.g. Al).

The P-type device 11b further includes a bottom barrier layer 107b (e.g. TiN) disposed between the gate dielectric layer 102b and the work function metal layer 127 and an etch stop metal layer 124b (e.g. TaN) disposed between the work function metal layer 127 and the bottom barrier layer 107b (e.g. TiN).

Referring to FIG. 1F-1, the semiconductor structure in the second area 100b is a P-type device 11d. The P-type device 11d is similar to the P-type device 11b, and the difference between them lies in that a tri-layer top barrier structure is provided for the P-type device 11d to replace the bi-layer top barrier structure for the P-type device 11b. The tri-layer top barrier structure includes, from bottom to top, an N-rich TiN layer 129b, a Ti-rich TiN layer 131b and a silicon-containing top barrier layer 132b (e.g. TiSiN).

In the semiconductor structures of the invention (e.g. devices 11a-11d), each of the work function metal layers 126/128a/128b, the top barrier layers 129a/129b/131a/131b and the silicon-containing top barrier layer 134a/134b has a substantially planar surface on the bottom surfaces of the gate trenches 122a/122b.

The said embodiment of the "high-k first" process is provided for illustration purposes, and is not construed as limiting the present invention. Another embodiment can be integrated with the "high-k last" process.

Second Embodiment

The second embodiment is similar to the first embodiment. The difference between first and second embodiments is described in the following, and the similarities are not iterated herein.

FIG. 2A to FIG. 2D-1 are schematic cross-sectional views illustrating a method of forming a semiconductor structure according to a second embodiment of the present invention.

Figure 2A:
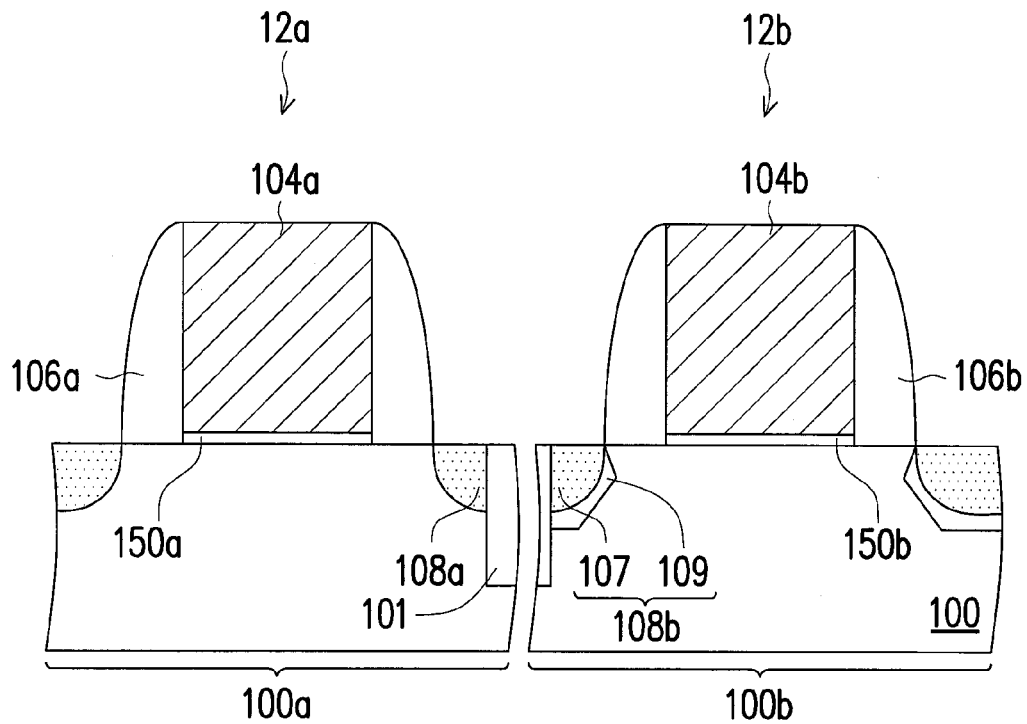

Referring to FIG. 2A, at least one gate structure is formed on a substrate 100. The substrate 100 has a first area 100a and a second area 100b, and gate structures 12a and 12b are respectively formed in the first and second areas 100a and 100b. At least one STI structure 101 is formed in the substrate 100 between the gate structures 10a and 10b for providing electrical isolation. The first and second areas 100a and 100b are for forming semiconductor devices with different conductivity types. In an embodiment, the first area 100a is for forming an N-type device, and the second area 100b is for forming a P-type device.

The gate structure 12a includes an interfacial layer 150a and a dummy gate 104a sequentially formed on the substrate 100. Similarly, the gate structure 12b includes an interfacial layer 150b and a dummy gate 104b sequentially formed on the substrate 100. Each of the interfacial layers 150a and 150b includes silicon oxide, and the forming method thereof includes performing a furnace process (e.g. thermal oxidation). Each of the dummy gates 104a and 104b includes amorphous silicon, crystalline silicon or a combination thereof, and the forming method thereof includes performing a deposition process (e.g. ALD or CVD).

Continue referring to FIG. 2A, the gate structure 12a further includes a spacer 106a formed on the sidewall of the dummy gate 104a. Similarly, the gate structure 12b further includes a spacer 106b formed on the sidewall of the dummy gate 104b. Besides, the gate structure 12a further includes two source/drain regions 108a formed in the substrate 100 beside the dummy gate 104a. Similarly, the gate structure 12b further includes two source/drain regions 108b formed in the substrate 100 beside the dummy gate 104b. In this embodiment, the source/drain regions 108a in the first area 100a can be N-type doped regions, and the source/drain regions 108b in the second area 100b can be combination of P-type doped regions 107 and SiGe layers 109, but the present invention is not limited thereto.

Figure 2B:
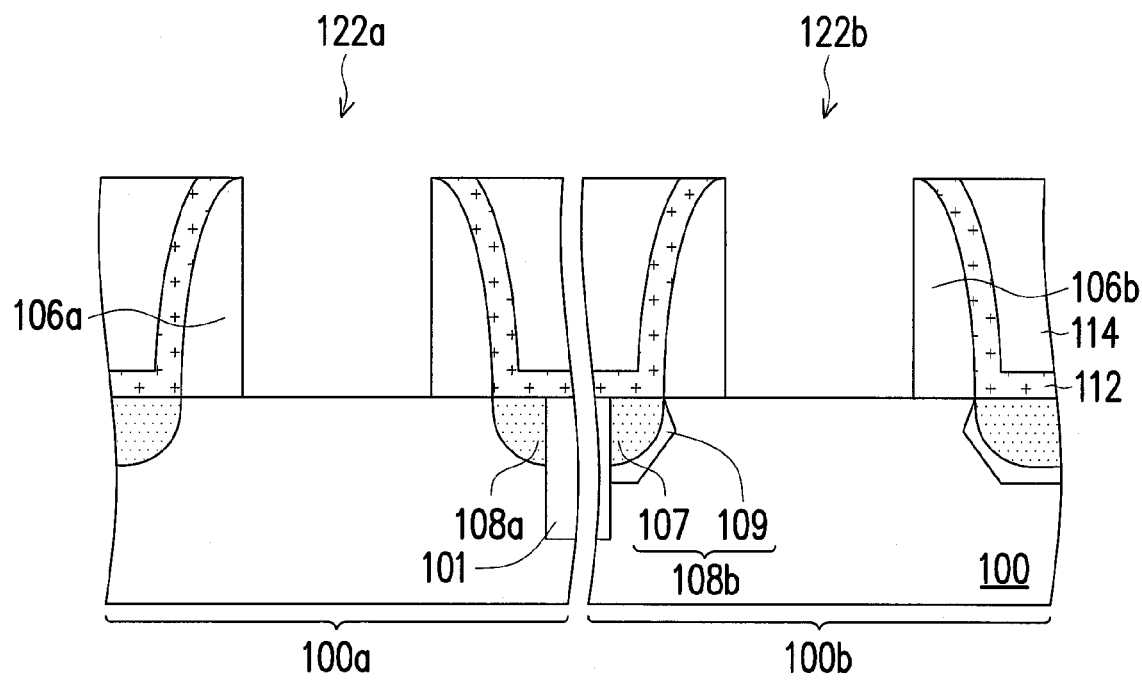

Referring to FIG. 2B, a contact etch stop layer (CESL) 112 and a dielectric layer 114 are formed between the gate structures 12a and 12b and at outer sides of the gate structures 12a and 12b. Thereafter, the dummy gates 104a and 104b and the interfacial layers 150a and 150b of the gate structures 12a and 12b are removed to form gate trenches 122a and 122b in the dielectric layer 114.

Figure 2C:
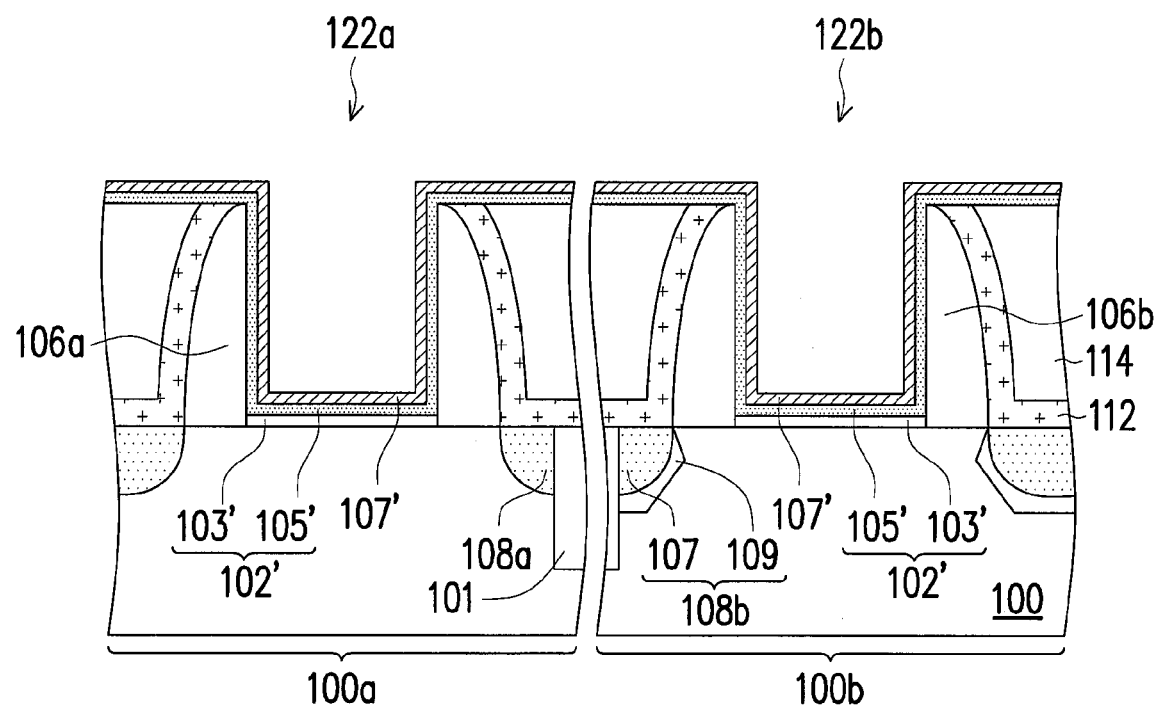

Referring to FIG. 2C, a gate dielectric layer 102' is formed on the surfaces of the gate trenches 122a and 122b. The gate dielectric layer 102' can be a composite layer containing an insulating layer 103' and a high-k layer 105'. The insulating layer 103' includes silicon oxide and the forming method thereof includes performing a furnace process (e.g. thermal oxidation). The high-k layer 105' includes a high-k material and the forming method the forming method thereof includes performing a deposition process (e.g. ALD or CVD). In this embodiment, the high-k layer 105' of the gate dielectric layer 102' can be formed on the bottoms and sidewalls of the gate trenches 122a and 122b. Thereafter, a bottom barrier layer 107' is formed on the gate dielectric layer 102'.

In view of the above, the substrate 100 has the dielectric layer 114 formed thereon. The dielectric layer 114 has the gate trenches 122a and 122b formed therein. The gate dielectric layer 102' is formed at least on the bottoms of the gate trenches 122a and 122b. Besides, the gate dielectric layer 102' (see FIG. 2C) is formed after the step of forming the gate trenches 122a and 122b (see FIG. 2B).

Figure 2D:
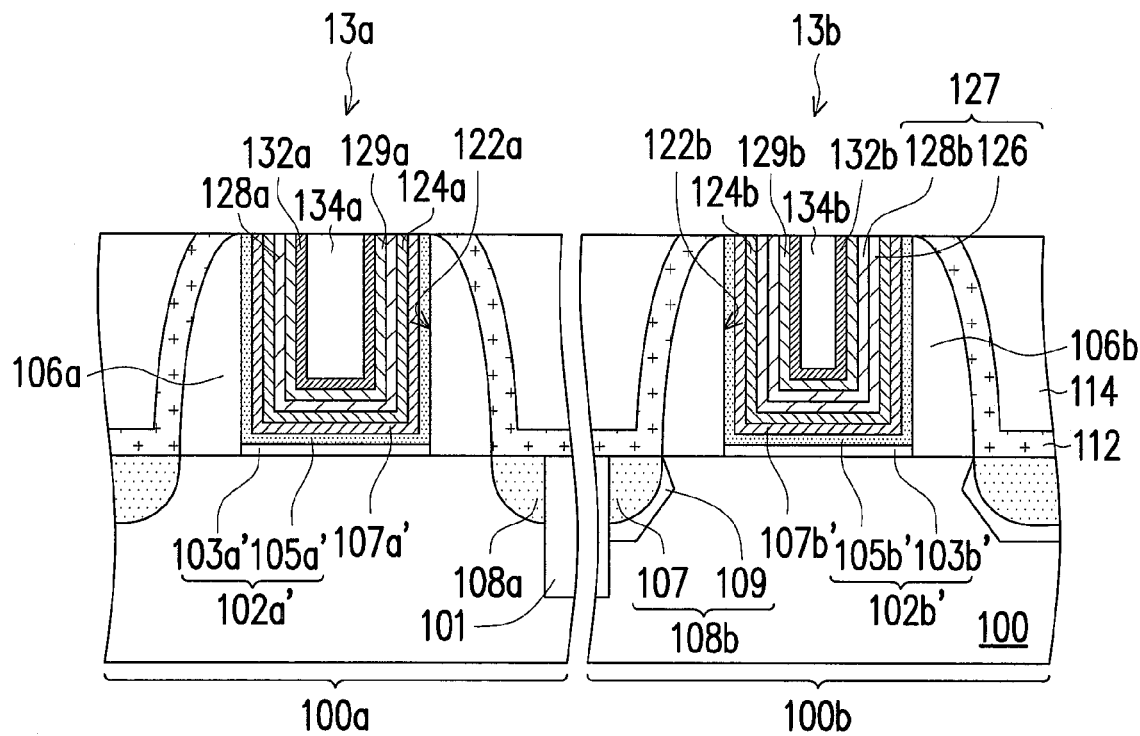
Figures 1, 2D:
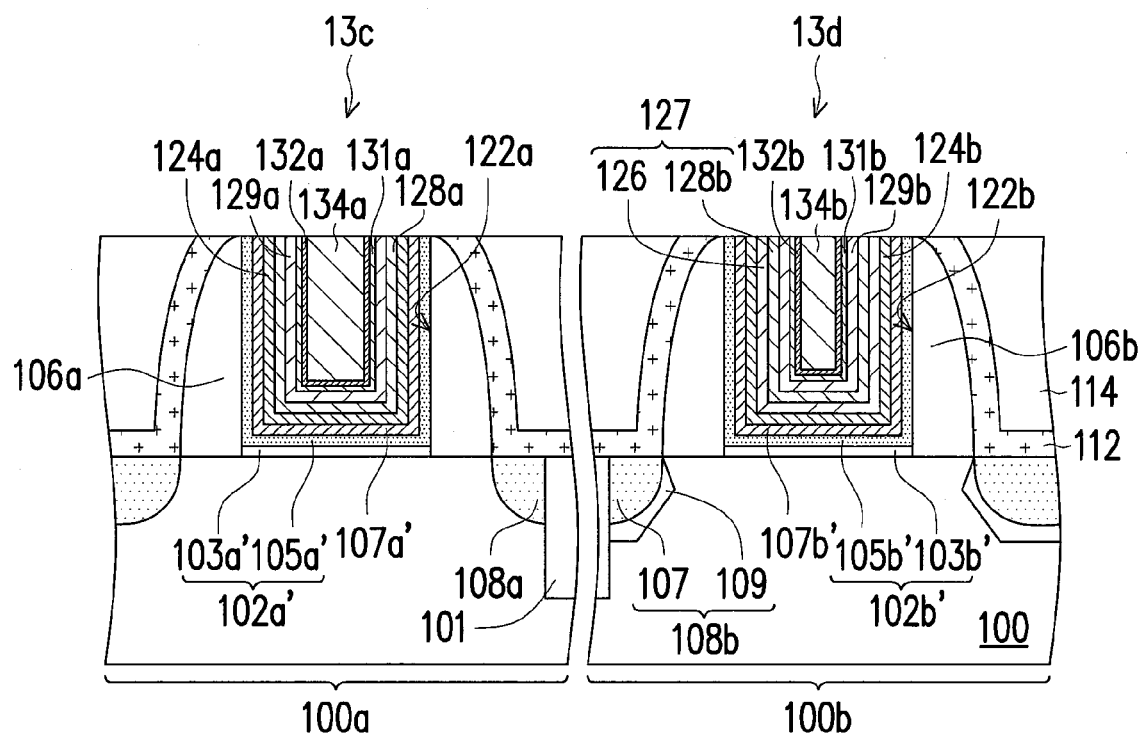

Referring to FIGS. 2D and 2D-1, the devices 13a-13d are obtained according to the steps described in FIG. 1C to FIG. 1F-1.

The semiconductor structures of FIGS. 2D and 2D-1 are similar to those of FIGS. 1F and 1F-1. The difference between them is described in the following and the similarities are not iterated herein.

Referring to FIGS. 2D/2D-1 and FIGS. 1F/1F-1, the N-type devices 13a-13d are similar to the N-type devices 11a-11d, except that the dispositions of the gate dielectric layers 102a'/102b' and the bottom barrier layers 107a'/107b' are slightly different from dispositions of the gate dielectric layers 102a/102b and the bottom barrier layers 107a/107b. Specifically, as compared to the gate dielectric layer 102a (or 102b), the gate dielectric layer 102a' (or 102b') of the N-type devices 13a/13c (or devices 13b/13d) is further disposed on the sidewall of the gate trench 122a (or 122b). Similarly, as compared to the bottom barrier layer 107a (or 107b), the bottom barrier layer 107a' (or 107b') of the N-type devices 13a/13c (or devices 13b/13d) is further disposed on the sidewall of the gate trench 122a (or 122b).

In summary, in the present invention, a silicification treatment and a nitridation treatment are performed to the surface of the multi-layer top barrier structure to stuff the grain boundaries of TiN and therefore forms TiSiN. The multi-layer top barrier structure having an upmost TiSiN layer can provide enough barrier properties to prevent diffusion of metals. Besides, with such method, the multi-layer top barrier structure can be formed with a uniform thickness at the bottom corner of the gate trench and therefore provides enough barrier properties. In addition, it is easy and simple to integrate the method of the invention into the existing CMOS process, thereby achieving competitive advantages over competitors.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor structure, comprising:
    a substrate;
    a dielectric layer, disposed on the substrate and having two gate trenches therein;
    two gate dielectric layers, at least disposed on a bottom of the two gate trenches;
    a low-resistivity metal layer, disposed in the two gate trenches;
    a work function metal layer, disposed between the low-resistivity metal layer and the gate dielectric layer, wherein the work function metal layer comprises a first work function metal layer and a second work function metal layer, and a material of the first work function metal layer and a material of the second work function metal layer are different;
    a silicon-containing top barrier layer, disposed between the low-resistivity metal layer and the work function metal layer, wherein the material of the silicon-containing top barrier layers in both trenches are same, and the silicon-containing top barrier layer comprises titanium silicon nitride (TiSiN); and
    at least one top barrier layer disposed between the work function metal layer and the silicon-containing top barrier layer,
    wherein each of the work function metal layer, the at least one top barrier layer and the silicon-containing top barrier layer has a substantially planar surface on the bottom surface of the gate trench.

2. The semiconductor structure of claim 1, wherein the top barrier layer is a Ti-rich TiN layer.

3. The semiconductor structure of claim 1, wherein the top barrier layer is an N-rich TiN layer.

4. The semiconductor structure of claim 1, further comprising a bottom barrier layer disposed between the gate dielectric layer and the work function metal layer.

5. The semiconductor structure of claim 1, wherein the gate dielectric layer is further disposed on a sidewall of the gate trench.

6. A semiconductor structure, comprising:
    a substrate;
    a dielectric layer, disposed on the substrate and having two gate trenches therein;
    two gate dielectric layers, at least disposed on a bottom of the two gate trenches;
    a low-resistivity metal layer, disposed in the two gate trenches;
    a work function metal layer, disposed between the low-resistivity metal layer and the gate dielectric layer, wherein the work function metal layer comprises a first work function metal layer and a second work function metal layer, and a material of the first work function metal layer and a material of the second work function metal layer are different;
    a silicon-containing top barrier layer, disposed between the low-resistivity metal layer and the work function metal layer, wherein the material of the silicon-containing top barrier layers in both trenches are same;
    at least one top barrier layer disposed between the work function metal layer and the silicon-containing top barrier layer;
    a bottom barrier layer disposed between the gate dielectric layer and the work function metal layer; and
    an etch stop metal layer disposed between the work function metal layer and the bottom barrier layer, wherein the etch stop metal layer comprises TaN,
    wherein each of the work function metal layer, the at least one top barrier layer and the silicon-containing top barrier layer has a substantially planar surface on the bottom surface of the gate trench.

7. A semiconductor structure, comprising:
a substrate;
a dielectric layer, disposed on the substrate and having two gate trenches therein;
two gate dielectric layers, at least disposed on a bottom of the two gate trenches;
a low-resistivity metal layer, disposed in the two gate trenches;
a work function metal layer, disposed between the low-resistivity metal layer and the gate dielectric layer, wherein the work function metal layer comprises a first work function metal layer and a second work function metal layer, a material of the first work function metal layer and a material of the second work function metal layer are different, and the material of the second work function metal layer comprises zirconium aluminide (ZrAl), tungsten aluminide (WAl), tantalum aluminide (TaAl), or hafnium aluminide (HfAl);
a silicon-containing top barrier layer, disposed between the low-resistivity metal layer and the work function metal layer, wherein the material of the silicon-containing top barrier layers in both trenches are same; and
at least one top barrier layer disposed between the work function metal layer and the silicon-containing top barrier layer,
wherein each of the work function metal layer, the at least one top barrier layer and the silicon-containing top barrier layer has a substantially planar surface on the bottom surface of the gate trench.

\* \* \* \* \*